United States Patent [19]
Lagrotta et al.

[11] Patent Number: 5,751,737
[45] Date of Patent: May 12, 1998

[54] BOUNDARY SCAN TESTING DEVICE

[75] Inventors: Joseph M. Lagrotta, Fort Collins; James L. Hutchinson, Boulder; Daniel G. Bihn; Kenneth P. Parker, both of Fort Collins; David J. Rustici, Loveland, all of Colo.; Keisuke Takaura, Ikomashi, Japan; Muneo Kawabata, Akaiwagun, Japan; Hiroyuki Ohki, Okayamaken, Japan; Takanori Uematsu, Tokyo, Japan

[73] Assignee: Hewlett-Packard Company, Palo Alto, Calif.

[21] Appl. No.: 805,553

[22] Filed: Feb. 26, 1997

[51] Int. Cl.⁶ .................................................. G06F 11/00
[52] U.S. Cl. .................................................. 371/22.32
[58] Field of Search ............................. 371/22.32, 22.31, 371/22.35; 395/183.06

[56] References Cited

U.S. PATENT DOCUMENTS 5,627,842  5/1997  Brown et al. .................... 371/22.3
5,668,817  9/1997  Adham ............................. 371/22.4

Primary Examiner—Vincent P. Canney

[57] ABSTRACT

A boundary scan testing device is presented which does not provide a boundary scan test vector generating function for producing boundary scan test vectors corresponding to the boundary scan device under test. Instead, the boundary scan testing device operates based on test vectors produced elsewhere.

3 Claims, 9 Drawing Sheets

! DATA PORTION

.
.
.
"112X"
"01ZX"   ! TEST LOGIC RESET
"112X"
"01ZX"   ! TEST LOGIC RESET
"11ZX"

! COMMENT PORTION
!
! BIT NUMBER     DEVICE              DEVICE          CONNECTING PIN    EXPECTED
! WITHIN PACKET  BOUNDARY SCAN       CONNECTING      SIGNAL NAME       VALUE
!                CELL NUMBER         PIN                               DATA
!
!    8              8                U4.15           U1_U3_10          HLLLHHHLH
!    9              9                U4.16           U1_U3_9           LHHHLLLLH
!    10             10               U4.17           U1_U2_8           LHHLLLHLH
!    11             11               U4.19           U1_U3_7           LHLHLHLLH
!    12             12               U4.20           U1_5              LHLLLHHLH
!    13             13               U4.21           U3_4              HLHHHLLLH
!    44             8                U2.15           U1_U3_10          HLLLHHHLH
!    45             9                U2.16           U1_U3_9           LHHHLLLLH
!    46             10               U2.17           U1_U3_8           LHHLLLHLH
!    50             14               U2.22           U1_3              LLHLHLHLH
!    51             15               U2.23           U1_2              LLLHHHLLH
!    54             0                U1.10           U1_U3_10          100011101
!    55             1                U1.9            U1_U3_9           011100001
!    56             2                U1.8            U1_U3_8           011000101
!    .              .                .               .                 .
!    .              .                .               .                 .
!    .              .                .               .                 .
!
!
!
!
!
!                        0 OR 1 INDICATES OUTPUT FROM BOUNDARY SCAN CELL;
!                        L OR H INDICATES INPUT INTO BOUNDARY SCAN CELL
!

*FIG. 3*

! BOUNDARY SCAN TEST EXPECTED DATA FILE
! CHAIN: U1_U8
! SOURCE: DIGITAL/U1_U8

BS_IC = U1, U2, U3, U4, U5, U6, U7, U8
TOTAL_BS_CELL = 188

| ! PACKET NUMBER | !EXPECTED-VALUE DATA |
|---|---|
| 1 | ``****HLLLLHHLHHLHHHLLHH*HLLHLLHHLL***LHHL``<br>``LLLLHLL*10000100111101111000111111001111110001``<br>``****LHHHLLHLLHLLHLLLHHHLLHHHLLLLL100011011``<br>``11000011101011110101110100001LLHHHHHLLLHHL``<br>``**HLLHHH`` |
| 2 | ``****LHHHHHLLLHHHHHLLHHHL*LHLLHLLHL***HLLH``<br>``HHHHLLH*011100101011101010100101010111100111``<br>``***LHHHLLHHLLHHHHHHLHLHLLHHHHHH0111000100``<br>``00111100010100010100001011111100HHHHH0111000100``<br>``LHHLLL`` |

FIG. 4

! 0 OR 1 INDICATES OUTPUT FROM BOUNDARY SCAN CELL;
! L OR H INDICATES INPUT INTO BOUNDARY SCAN CELL

```
.
.
.
U1_U3_10       ! SIGNAL NAME
    U4.15      !DEVICES, CONNECTING PINS CONNECTED TO SIGNAL NAME
    U2.15
    U1.10
    R1001.1
    IC6201.15
U1_U3_9        ! SIGNAL NAME
    U4.16      !DEVICES, CONNECTING PINS CONNECTED TO SIGNAL NAME
    U2.16
    U1.9
    IC6201.17
U1_U3_8        ! SIGNAL NAME
    U4.17      !DEVICES, CONNECTING PINS CONNECTED TO SIGNAL NAME
    U2.17
    U1.8
    IC6201.18
    D201.1
U1_U3_7        ! SIGNAL NAME
    U4.19      !DEVICES, CONNECTING PINS CONNECTED TO SIGNAL NAME
    U6.23
U1_U3_6        ! SIGNAL NAME
    U4.20      !DEVICES, CONNECTING PINS CONNECTED TO SIGNAL NAME
.
.
.
```

*FIG. 5*

| SIGNAL NAME ID | CONNECTING PIN SIGNAL NAME | DEVICE CONNECTING PIN | DEVICE BOUNDARY SCAN CELL | BIT NUMBER WITHIN PACKET |
|---|---|---|---|---|
| 1 | U1_U3_10 | U4.15 | 8 | 8 |
| 1 | U1_U3_10 | U2.15 | 8 | 44 |
| 1 | U1_U3_10 | U1.10 | 0 | 54 |
| 2 | U1_U3_9 | U4.16 | 9 | 9 |
| 2 | U1_U3_9 | U2.16 | 9 | 45 |
| 2 | U1_U3_9 | U1.9 | 1 | 55 |
| 3 | U1_U3_8 | U4.17 | 10 | 10 |
| 3 | U1_U3_8 | U2.17 | 10 | 46 |
| 3 | U1_U3_8 | U1.8 | 2 | 56 |
| 4 | U1_U3_7 | U4.19 | 11 | 11 |
| 4 | U1_U3_7 | U1.Y | 3 | 57 |
| 5 | U1_5 | U4.20 | 12 | 12 |
| 5 | U1_5 | U1.5 | 5 | 59 |
| 6 | U3_4 | U4.21 | 13 | 13 |
| 6 | U3_4 | U3.4 | 32 | 81 |
| 7 | U1_3 | U2.22 | 63 | 121 |
| 7 | U1_3 | U1.3 | 7 | 63 |

*FIG. 7*

1  *****HLLLLHHLHHHLHHHLLHH*HLLHLLHHLL***LHHL
LLLLHLL*100001001110111100111111001111 0001
*******LHHLLHHLLHLLHLHLLHHHLLHHHLL100011 1011
11000111010111010111101000011LLHHHHHLLHHL**
**HLLHHH

2  *****LHHHHHLLLHHHHHLLHHHL*LLHLLHLLHL***HLLH
HHHHLLH*0111001010111010101100101010111100111
****LHHHLLHLLHHLLHHHHHLHLHLLHHHHHO111000100
0011110001010001010000101011110OHHHHH01 11000100
**LHHLLL . . .

FIG. 8

BOUNDARY SCAN TESTING DEVICE

FIELD OF THE INVENTION

The present invention relates generally to the field of boundary scan testing of integrated circuits, and more particularly to a boundary scan testing device which may perform a boundary scan test on a boundary scan device based on boundary scan test vectors generated by a separate boundary scan test vector generator.

BACKGROUND OF THE INVENTION

VLSI circuit technology is rapidly changing due to increases in VLSI circuit complexity, coupled with higher performance and smaller sizing requirements. Increasing importance of improving manufacturing testing techniques at all levels of VLSI integration is emerging due to newer technology, pressures for higher production yield requirements, and tighter time-to-market schedules. Boundary scan testing methodology is known in the art. Generally, boundary scan testing is a technique used to map a sequential circuit test generation problem into a combinational circuit test generation problem. Circuits must be pre-designed to include scanpath test hardware, which may include isolated or integrated scan or shadow registers.

FIG. 1 is a block diagram of a conventional boundary scan testing device, shown generally at 10. As shown in FIG. 1, the boundary scan testing device 10 includes a boundary scan test vector generator 12. The boundary scan test vector generator 12 receives as input a boundary scan description language (BSDL) file 2 and computer aided design (CAD) data 4. The BSDL file 2 contains a description of the boundary scan cell structures of a boundary scan device, shown at 30, and commands for shifting to various boundary scan modes. The CAD data 4 includes circuit diagram information, including device boundary scan cell numbers, connecting pin numbers and connecting pin signal names. The boundary scan test vector generator 12 produces boundary scan test vectors based on the BSDL file 2 and CAD data 4. The boundary scan testing device 10 may be set up to test the boundary scan device 30 under various test conditions via a test condition controller 14. The boundary scan testing device 10 includes a test execution data generator 16 which receives the boundary scan test vectors from the boundary scan test vector generator 12 and test condition data from the test condition controller 14, and produces test execution data.

The conventional boundary scan testing device 10 of FIG. 1 also includes a test executor 20. The test executor 20 includes a test controller 21 which controls the overall execution of the boundary scan test on the basis of test execution data received from the test execution data generator 16. The test executor 20 may also include a fault analyzer 22 which analyzes the causes of faults and locations of faults occurring when the boundary scan test is executed. A test signal processor 26 may also be provided in the test executor 20 for inputting and outputting boundary scan test signals to and from the test controller 21. The test executor 20 may further include a result data recorder 24 which records result data from the boundary scan test into a data records file 25.

The boundary scan testing device 10 may be used to test combinational logic within a boundary scan device. The boundary scan device 30 shown in FIG. 1 includes, for illustration purposes, three boundary scan cells 31–33. As known in the art, a boundary scan device may include any number of boundary scan cells. As shown in FIG. 1, each of the boundary scan cells 31–33 comprise boundary scan test signal terminals including the terminals test data in (TDI), test data out (TDO), test clock (TCK) and test mode select (TMS). The test signal processor 26 also includes boundary scan test signal terminals TDI, TDO, TCK and TMS. In the embodiment shown in FIG. 1, the TCK and TMS terminals of the boundary scan cells 31–33 and the test signal processor 26 are tied together such that each of the boundary scan cells 31–33 receive the same test clock and test mode select signals at the same time. As also shown in the embodiment of FIG. 1, the TDO terminal of the test signal processor 26 is electrically connected to the TDI terminal of the boundary scan cell 31, the TDO terminal of the boundary scan cell 31 is electrically connected to the TDI of the boundary scan cell 32, the TDO terminal of the boundary scan cell 32 is electrically connected to the TDI of the boundary scan cell 33, and the TDO terminal of the boundary scan cell 33 is electrically connected to the TDI terminal of the test signal processor 26. In addition, the boundary scan test output terminals A1 and A2 of the boundary scan cell 31 are electrically connected to the boundary scan test input terminals B1 and B2 of the boundary scan cell 32. The terminal A1 of the boundary scan cell 31 and the terminal B1 of the boundary scan cell 32 are also electrically connected to a first terminal of a connector 36, and the terminal A2 of the boundary scan cell 31 and the terminal B2 of the boundary scan cell 32 are connected to a second terminal of the connector 36. Additionally, the boundary scan test output terminals C1 and C2 of the boundary scan cell 32 are electrically connected to the boundary scan test input terminals D1 and D2 of the boundary scan cell 33. A digital input-output (I/O) controller 23 in the test executor 20 of the boundary scan testing device 10 inputs and outputs additional digital signals besides the boundary scan test signals TDI, TDO, TCK and TMS, which are used for the testing of the boundary scan device 30. The boundary scan device 30 shown in FIG. 1 also includes an inverter 34 and a buffer 35. The output of the buffer 35 is electrically connected to the input of the inverter 34. The output of the inverter 34 is electrically connected to the boundary scan test input terminal G of the boundary scan cell 33. Both the output of the buffer 35 and the input of the inverter 34 are connected to the output terminal of the digital I/O controller 23.

The boundary scan testing device 10 operates as follows. First, the BSDL file 2, which contains BSDL files for the boundary scan cells 31–33 of the boundary scan device 30, and the CAD data 4, which includes circuit diagram information for the boundary scan device 30 are supplied to the boundary scan test vector generator 12 of the boundary scan testing device 10. Accordingly, the boundary scan test vector generator 12 extracts the circuit that is to be subjected to boundary scan testing from the CAD data 4, and produces boundary scan test vectors corresponding to the boundary scan device 30 on the basis of a descriptive format known as vector control language (VCL) while referring to the BSDL file 2, in which the boundary scan cell structures of the boundary scan cells 31–33 and commands for shifting to various boundary scan modes are described. The boundary scan test vectors thus produced are transferred to the test execution data generator 16 from the boundary scan test vector generator 12. Test conditions for the test may be set via the test condition controller 14, which are transferred to the test execution data generator 16 from the test condition controller 14. The test execution data generator 16 then corrects the boundary scan test vectors of the boundary scan device 30 in accordance with these test conditions, and produces test execution data. A boundary scan test is then performed by the test executor 20 on the basis of the test execution data thus produced.

The test controller 21 controls the overall execution of the boundary scan test according to the test execution data. The test controller 21 sends a command to the test signal processor 26 indicating that boundary scan test signals are to be sent out in accordance with the test execution data. The test signal processor 26, acting in accordance with the aforementioned command, outputs test clock TCK and test mode select TMS boundary scan test signals to all of the boundary scan cells 31–33 of the boundary scan device 30 on the basis of the test execution data, and shifts a TDO boundary scan test signal through the boundary scan cells 31–33 via the TDI terminal of the boundary scan cell 31 of the boundary scan device 30. Afterward, the boundary scan test signals are output as latch output to the boundary scan test output terminals A1 and A2 and boundary scan test output terminals C1 and C2. The boundary scan test result signals are then read into the boundary scan test input terminals B1, B2, D1 and D2. The signals at the boundary scan test input terminals and output terminals A1, A2, B1, B2, C1, C2, D1 and D2 are then shifted through the boundary scan cells 31–33 and are input into the TDI terminal of the test signal processor 26 via the TDO terminal of the boundary scan cell 33. The series of signal flows just described is the series of signal flows that occurs when one boundary scan test pattern vector, or hereinafter "packet", is tested. FIG. 2 illustrates the series of signal flows. As shown in FIG. 2, the series of signal flows which occur when a single packet is tested on the boundary scan device includes a boundary scan test signal shift 201 followed by a boundary scan test signal latch output 202 followed by a boundary scan test result signal read-in 203 followed by a boundary scan test result signal shift 204.

At the same time that this boundary scan test is being executed, the digital I/O controller 23 operates so that logic signals of "1" or "0" continue to be output from the output terminal of the digital I/O controller 23 to both the output of the buffer 35 and the input terminal of the inverter 34 in the boundary scan device 30 only during the interval extending from the boundary scan test signal latch output 202 to the boundary scan test result signal read-in 203 in FIG. 2. Accordingly, in the case of output from the inverter 34 in response to these signals, signals which are input into the boundary scan test input terminal G of the boundary scan cell 33 are taken into the boundary scan test input terminal G of the boundary scan cell 33 during the boundary scan test result signal read-in 203 shown in FIG. 2, and are shifted according to the timing of the boundary scan test result signal shift 204 and input into the TDI terminal of the test signal processor 26 together with the signals at the boundary scan test input terminals and output terminals A1, A2, B1, B2, C1, C2, D1, and D2.

The test signal processor 26 performs a comparison to determine whether or not the data of the boundary scan test result signals shifted back to the TDI terminal of the test signal processor 26 agrees with the expected-value data predicted from the boundary scan test signals in accordance with the test execution data. The expected-value data is produced at the same time that the boundary scan test vectors are produced from the BSDL file 2 and CAD data file 7 by the boundary scan test vector generator 12. However, the expected-value data cannot be expressed within the boundary scan test vectors, which are expressed in the aforementioned VCL descriptive format. Accordingly, for convenience, the expected-value data is expressed together with the circuit information, including device boundary scan cell numbers, connecting pin numbers and connecting pin signal names, in the comment portion located at the end of the boundary scan test vector data as a reference which can be used when a person views and interprets the boundary scan test vectors.

FIG. 3 shows a portion of an example boundary scan test vector comment portion. The upper part of FIG. 3 corresponds to the boundary scan test vector data portion, while the lower part of FIG. 3 is the comment portion which is located at the end of the boundary scan vector data portion and which indicates the expected-value data and circuit information. The comment portion in FIG. 3 which indicates expected-value data and circuit information shows (from left to right) bit numbers within the packet, boundary scan cell numbers of devices, device names and connecting pin numbers of said devices, device connecting pin signal names, and expected-value data. The data of the nine bits in the horizontal direction seen in each line of expected-value data indicates data corresponding to nine packets. Among the expected-value data, the data expressed in terms of 0 or 1 is output data from the boundary scan cells, while the data expressed in terms of L or H is input data for the boundary scan cells. In cases where the connecting pin signal names of devices are the same (for example, in FIG. 3, U1_U3_IO is the same in three places), this indicates that the connecting pins of these devices are linked together. Accordingly, when the respective nine-packet portions of expected-value data in these three places are compared in terms of input and output, the values are the same.

Since the data expressed in the boundary scan test vector comment portion shown in FIG. 6, however, cannot be expressed as meaningful data in the VCL descriptive format, it cannot be interpreted by the test execution data generator 16. Accordingly, the test signal processor 26 reads in an expected-value data file, an example of which is shown in FIG. 4, which is produced at the same time that boundary scan test vectors are produced from the BSDL file 2 and CAD data 4 by the boundary scan vector producing part 12. Referring to FIG. 4, the head portion indicates that the connection of boundary scan cells is a connection of U1, U2, U3 . . ., U8, and that the total number of boundary scan cells of U1, U2, U3, . . . U8 is 188. The expected values at bit numbers corresponding to boundary scan cells 1 through 188 in each packet are expressed as 0 or 1 when the boundary scan cell is output, as H or L when the boundary scan cell is input, and as * in the case of indeterminate values.

If the boundary scan device 30 is normal, the data of the boundary scan test result signals show agreement with the expected-value data. However, if there is a fault in the boundary scan device 30, the data of the boundary scan test result signals differs from the expected-value data. When the test signal processor 26 performs a comparison of the boundary scan test result signals with the expected-value data, it signals either agreement via an agreement signal OK or disagreement via a disagreement signal NG. The OK/NG results for the boundary scan device 30 are returned to the test controller 21 from the test signal processor 26. If the results are OK, the test controller 21 sends an instruction to the result data recorder 24 indicating that the results should be recorded, and the result data recorder 24 records the OK results in the data records file 25. On the other hand, in cases where the results are NG, the test controller 21 sends an instruction to the fault analyzer 22 so that the boundary scan test result signal data which has returned to the test signal processor 26 and the expected-value data predicted from the test signals in accordance with the test execution data are taken in by the fault analyzer 22 from the test signal processor 26 via the test controller 21. The fault analyzer 22 also receives circuit information for the tested circuit portions of the boundary scan device 30 which is necessary in order to specify the nature and location of the fault. The fault analyzer 22 then analyzes the nature and location of the fault in the boundary scan device 30.

Here, as well, the circuit information for the circuit portion being tested within the boundary scan device 30 cannot be expressed within the boundary scan test vector data portion, which is expressed in the aforementioned VCL descriptive format. Accordingly, for convenience, the device boundary scan cell numbers, connecting pin numbers and connecting pin signal names are expressed as shown in the example of FIG. 3 together with the expected-value data in the comment portion, as a reference which can be used when a person views and interprets the boundary scan test vectors. However, this data cannot be interpreted by the test execution data generator 16, and is therefore not usable data. Accordingly, circuit information for the circuit portions being tested within the boundary scan device 30 which is created when the boundary scan test vectors are produced in the boundary test vector producing part 12 is taken in by the fault analyzer 22 from the boundary scan test vector generator 12 as a board file of the type shown in FIG. 5.

As shown in FIG. 5, the board file contains each signal name (U1_U3_10, U1_U3_9, etc.) and the names of the connecting pins of all devices connected to it are shown for said signal name. It is appreciated from FIGS. 3 and 5 that while only the device connecting pins of the boundary scan cells connected by the signal names are expressed in the circuit information shown in the boundary scan test vector comment portion of FIG. 3, the connecting pins of all devices connected to the signal names are expressed in the board file of in FIG. 5. Accordingly, the circuit information in the board file of FIG. 5 is more detailed than the data expressed in the boundary scan test vector comment portion of FIG. 3.

As an illustration of the operation of the fault analyzer 22, if a short circuit should occur between the wiring A1–B1 and A2–B2 of the boundary scan cells 31 and 32 in FIG. 1, the cause of this fault is analyzed as a short circuit occurring between the terminals A1, A2, B1 and B2 of the boundary scan cells 31 and 32 and the first and second terminals of the connector 36.

Results including the nature and location of faults obtained by analysis are returned to the test controller 21 by the fault analyzer 22. The test controller 21 sends an instruction to the result data recorder 24 indicating that these results including the nature and location of faults should be recorded, and the result data recorder 24 records the results in the data records file 25.

The conventional boundary scan testing device as described above is problematic. The boundary scan test vector generator 12 which produces boundary scan test vectors is an expensive constituent element of the boundary scan testing device 10. Furthermore, the system is constructed to include the test executor 20, test execution data generator 16 and test condition controller 14 at additional expense. Accordingly, the boundary scan testing device 10 of FIG. 1 is very expensive. Additionally, boundary scan board manufacturing sites where boundary scan tests are actually performed may have numerous boundary scan testing devices 10 in operation. At these boundary scan board manufacturing sites, however, the portions of the boundary scan testing devices 10 that actually operate are limited almost exclusively to the test executors 20. Furthermore, the test execution data generators 16 and test condition controllers 14 of these boundary scan testing devices 10 generally operate only when the test conditions are altered. The boundary scan test vector generators 12 of these boundary scan testing devices 10 merely supply expected-value data and circuit information for the circuit portions being tested within the boundary scan device 30 in response to requests from the test signal processors 26 and fault analyzers 22 of the boundary scan testing devices 10. Moreover, as long as there is no change in the circuit construction of the boundary scan device 30, the inherent boundary scan test vector producing function of the boundary scan test vector generator 12 is not utilized.

Accordingly, at boundary scan board manufacturing sites where boundary scan tests are actually performed, the use of expensive boundary scan testing devices 10 with boundary scan test vector generators 12 whose functions are hardly ever used leads to a great increase in manufacturing costs. Furthermore, since such boundary scan testing devices 10 are expensive, it has been difficult to popularize boundary scan testing.

SUMMARY OF THE INVENTION

The present invention solves the abovementioned conventional problems, and provides a boundary scan testing device with an analysis data producing function that produces expected-value data and circuit information necessary for the analysis of test results from the comment portions appended to boundary scan test vector data without using a boundary scan test vector generator 12. By executing a boundary scan test using the construction of the present invention, which uses separately produced boundary scan test vectors, boundary scan tests can be performed much more inexpensively.

In order to achieve the abovementioned object, the boundary scan testing device of the present invention comprises a test execution data generator which uses boundary scan vectors, which correspond to a boundary scan device under test and which are produced by a boundary scan test vector generator separate from said boundary scan testing device. The test execution data generator produces execution data based on the boundary scan test vectors and on test conditions. The boundary scan testing device of the present invention also comprises a test condition controller which sets said test conditions and a test executor which executes a boundary scan test based on said execution data. The boundary scan testing device of the present invention also comprises an analysis data generator which produces analysis data which includes circuit information for the boundary scan device under test and expected value data from comment portions of the boundary scan vectors which, while being added to said boundary scan vectors, are not used in the production of the execution data. The analysis data allows the boundary scan testing device of the present invention to analyze test results of the boundary scan test.

The boundary scan testing device of the present invention may further comprise an interface box which includes a boundary scan interface circuit having boundary scan test signal connections for inputting and outputting boundary scan test signals. Using the interface box, boundary scan device under test and boundary scan interface circuit can be connected to form a single boundary scan circuit which increases the range of testing of the boundary scan device under test.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which:

FIG. 3 is a portion of a boundary scan test vector data file, which includes comment portions.

FIG. 4 shows a conventionally used expected-value data file.

FIG. 5 shows a conventionally used board file.

FIG. 7 shows a connection correspondence table constructed from the comment portion of a boundary scan test vector file.

FIG. 8 is a block diagram of a boundary scan testing device in accordance with a second embodiment of the present invention.

DETAILED DESCRIPTION OF THE PRESENT INVENTION

Figure 6:
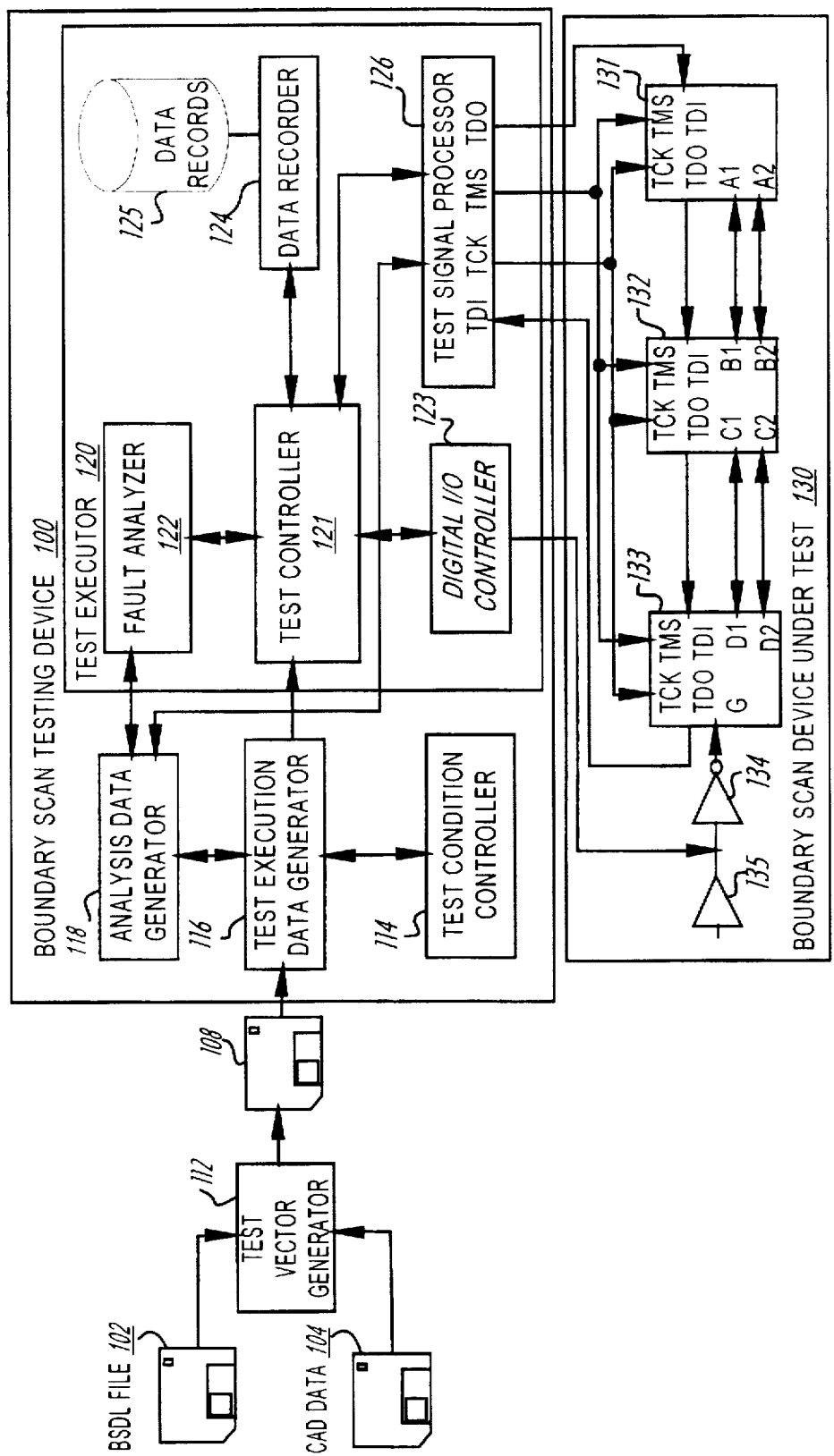
FIG. 6 is a block diagram of a boundary scan testing device in accordance with a first embodiment of the present invention.

Turning now to the present invention, FIG. 6 is a block diagram of a first preferred embodiment of a boundary scan testing device 100 of the present invention. As shown in FIG. 6, the boundary scan testing device 100 does not include means for producing boundary scan test vectors. Instead, a boundary scan test vector generator 112 resides separately from the boundary scan testing device 100, perhaps on a separate host computer or at another site separate from the manufacturing site. The boundary scan test vector generator 112 receives a description of the boundary scan cell structure of a device under test 130 and boundary scan mode shifting commands from a boundary scan description language (BSDL) file 102 and computer-aided design (CAD) data 104 including circuit diagram information for the device under test 130, and produces boundary scan test vectors for use in testing the device under test 130. The boundary scan test vectors produced by the boundary scan test vector generator 112 are recorded in a test vector file 108.

The boundary scan testing device 100 includes a test execution data generator 116 which produces test execution data from the test vector file 108 and data from a test condition controller 114 which may be used to set various testing conditions. The boundary scan testing device 100 also includes an analysis data generator 118. The analysis data generator 118 receives the contents of the test vector file 108 input into the test execution data generator 116 and produces analysis data from the comment portions of the test vector file 108. Analysis data is necessary in order to specify the nature and location of faults that occur when a boundary scan test is executed.

The boundary scan testing device 100 also includes a test executor 120. The test executor 120 includes a test controller 121 which controls the overall execution of the boundary scan test based on test execution data received from the test execution data generator 116. The test executor 120 also includes a fault analyzer 122 which analyzes the causes of faults and locations of faults occurring when the boundary scan test is executed. A test signal processor 126 is also included in the test executor 120. The test signal processor 126 performs the I/O of boundary scan test signals under the control of the test controller 121, and includes boundary scan test signal terminals TDI, TDO, TCK, and TMS for boundary scan test signals including test data in (TDI), test data out (TDO), test clock (TCK) and test mode signal (TMS). The test executor 120 also includes a result data recorder 124 which controls result data from the boundary scan test and records it in a data records file 125.

A device under test 130 may be tested by the boundary scan testing device 100. The boundary scan device 30 shown in FIG. 6 includes three boundary scan cells 131–133 for illustrative purposes. As known to one skilled in the art, however, the boundary scan device 30 may include any number of boundary scan cells. Each of the boundary scan cells 131–133 include boundary scan test signal terminals TDI, TDO, TCK, and TMS for boundary scan test signals including test data in (TDI), test data out (TDO), test clock (TCK) and test mode signal (TMS). As shown in FIG. 6, each of the TCK and TMS terminals of the test signal processor 126 and the boundary scan cells 131–133 are tied together such that each of the boundary scan cells 131–133 receive the same test clock and test mode select signals at the same time. As also shown in FIG. 6, the TDO terminal of the test signal processor 126 is electrically connected to the TDI terminal of the boundary scan cell 131, the TDO terminal of the boundary scan cell 131 is electrically connected to the TDI of the boundary scan cell 132, the TDO terminal of the boundary scan cell 132 is electrically connected to the TDI of the boundary scan cell 133, and the TDO terminal of the boundary scan cell 133 is electrically connected to the TDI terminal of the test signal processor 126. In addition, the boundary scan test output terminals A1 and A2 of the boundary scan cell 131 are electrically connected to the boundary scan test input terminals B1 and B2 of the boundary scan cell 132. The terminal A1 of the boundary scan cell 31 and the terminal B1 of the boundary scan cell 132 are also electrically connected to a first terminal of a connector 136, and the terminal A2 of the boundary scan cell 131 and the terminal B2 of the boundary scan cell 132 are connected to a second terminal of the connector 136. Additionally, the boundary scan test output terminals C1 and C2 of the boundary scan cell 132 are electrically connected to the boundary scan test input terminals D1 and D2 of the boundary scan cell 133. The test executor 120 of the boundary scan testing device 100 includes a digital input-output (I/O) controller 123 for inputting and outputting additional digital signals besides the boundary scan test signals TDI, TDO, TCK and TMS, which may be used for testing the boundary scan device 130. The boundary scan device 130 shown in FIG. 6 also includes an inverter 134 and a buffer 135. The output of the buffer 135 is electrically connected to the input of the inverter 134. The output of the inverter 134 is electrically connected to the boundary scan test input terminal G of the boundary scan cell 133. Both the output of the buffer 135 and the input of the inverter 134 are connected to the output terminal of the digital I/O controller 123.

The boundary scan testing device 10 operates as follows. First, the BSDL file 102, which contains BSDL files for the boundary scan cells 131–133 of the boundary scan device 130, and the CAD data 104, which includes circuit diagram information for the boundary scan device 130 are supplied to the boundary scan test vector generator 112, which is located separately from the boundary scan testing device 100. Accordingly, the boundary scan test vector generator 112 extracts the circuit that is to be subjected to boundary scan testing from the CAD data file 104, and produces boundary scan test vectors corresponding to the boundary scan device 130 in the vector control language (VCL) format while referring to the BSDL file 102, in which the boundary scan cell structures of the boundary scan cells 131–133 and commands for shifting to various boundary scan modes are described. This boundary scan test vector data is output to the test vector file 108.

The test vector file 108 may be supplied to the test execution data generator 116 of a boundary scan testing device 100 at a later time. The boundary scan testing device 100 may reside at a different location than the boundary scan test vector generator 112, possibly at a diagnostics site or another manufacturing site. For example, the boundary scan test vector generator 112 may reside at a research and development R&D site, while several boundary scan testing device may reside at a separate manufacturing site with individual personal computers (PCs) or workstations as the host computers. When a device under test 130 is to be tested, the test vector file 108 is supplied to the test execution data generator 116 of the boundary scan testing device 100. Thus in the current example, the test vector file 108 would be produced by the boundary scan test vector generator 112 at the R&D site, and then sent to the manufacturing site and downloaded or copied to the PCs or workstations at the manufacturing site for use by the boundary scan testing device 100 of the present invention. Test conditions for testing the boundary scan device 130 may be set via the test condition controller 114. The test conditions are then transferred to the test execution data generator 116 from the test condition controller 114. The test execution data generator 116 then corrects the boundary scan test vectors of the boundary scan device 130 in accordance with these test conditions, and produces test execution data.

In the meantime, the analysis data generator 118 receives the contents of the test vector file 108 from the test execution data generator 116. In this case, the circuit information, including expected-value data and device boundary scan cell numbers, connecting pin numbers and connecting pin signal names, are not handled as comments which are expressed for convenience in a comment portion located at the end of the test vector file 108, which is expressed in the aforementioned VCL descriptive format as shown in FIG. 3. Instead, such information is arranged by the analysis data generator 118 so that it can be used as data for specifying the nature and location of faults that occur when a boundary scan test is performed. The analysis data generator 118 accomplishes this by preparing and storing a table based on connection correspondences as circuit information for the circuit portions that are to be subjected to boundary scan testing within the device under test 130. FIG. 7 shows an example of a table prepared by the analysis data generator 118 for a boundary scan device 130 having the same connections and connecting pin signal names as the example shown in FIG. 3. However, in the case of the device connecting pins connected to the respective connecting pin signal names in the circuit information shown in FIG. 7, only the connecting pin signal names of the boundary scan cells 131–133 are expressed. Accordingly, this information is not as detailed as the circuit information in the conventional board file shown in FIG. 5. It will be appreciated from the above discussion that FIG. 7 is a table based on connection correspondences in which items with the same connecting pin signal name in FIG. 3 are collected and given the same signal name ID, so that the respective device connecting pins, device boundary scan cells and bit numbers within packets are rearranged.

The analysis data generator 118 also rearranges the expected-value data expressed in the comment portion from the format shown in FIG. 3 to bit number order corresponding to the order of the boundary scan cell numbers in each packet as a single data set for each packet. This arrangement is shown in FIG. 8. With expected-value data in places where there is drop-out in the bit numbers inside packets that are to be connected being expressed as indeterminate values, the data is rearranged as shown in FIG. 8 in the same manner as the data obtained by the boundary scan test result signal shift during the performance of the boundary scan test. This data is prepared and stored as expected-value data.

Thus, it is clear that FIG. 8 is a rearrangement of FIG. 3. In FIG. 3, the expected-value data is lined up in the order packet 1, packet 2, packet 3 and so on from the leftmost column so that the data in the leftmost column of expected-value data corresponding to a bit number within each packet is data corresponding to packet 1. Accordingly, if the data is rearranged as a single data set for each packet, the arrangement shown in FIG. 8 is obtained. Thus, the leftmost data of the expected-value data corresponding to bit number 8 within each packet in FIG. 3 is H, and this data is the same as the $8^{th}$ bit from the left in the expected-value data of packet 1 in FIG. 8. Furthermore, the contents of FIG. 8 are the same as the contents of the expected-value data shown in the expected-value data file in FIG. 3.

Thus, using circuit information that includes device boundary scan cell numbers, connecting pin numbers and connecting pin signal names, as well as expected-value data, which cannot be expressed as meaningful data within the boundary scan test vector data (which is expressed in the aforementioned VCL descriptive format), but which is instead expressed for convenience in a comment portion located at the end of the boundary scan test vector data within the test vector file 108 as a reference which can be used when a person examines the boundary scan test vectors, the analysis data generator 118 regenerates circuit information and expected-value data as meaningful data which can be utilized for the judgement of results and analysis of faults in boundary scan testing.

Figure 1:
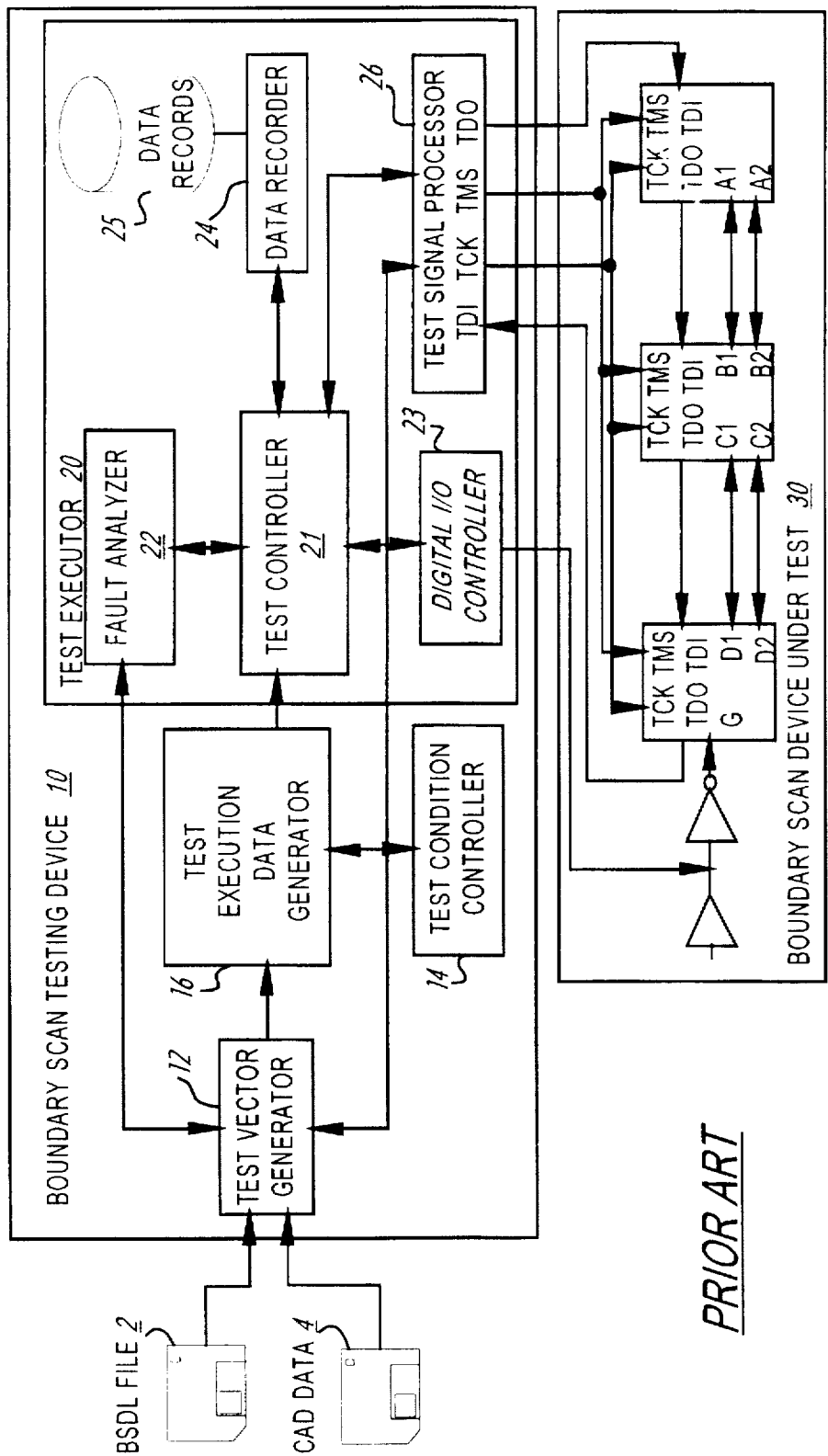
FIG. 1 is a block diagram of a conventional boundary scan testing device.
Figure 2:
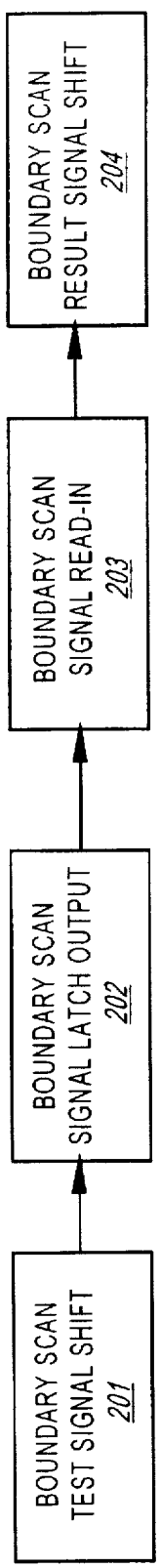
FIG. 2 is a diagram which shows the series of signal flows of the boundary scan test signals.

Boundary scan testing is executed by the test executor 120 based on test execution data produced by the test execution data generator 116 of the boundary scan testing device 100. The test executor 120 includes a test controller 121 which controls the overall execution of the boundary scan test based on the test execution data. The test controller 121 sends a command to the test signal processor 126 indicating that boundary scan test signals are to be sent out in accordance with the test execution data. The test signal processor 126, acting in accordance with the aforementioned command, outputs TCK and TMS boundary scan test signals to all of the boundary scan cells 131–133 of the boundary scan device 130 on the basis of the test execution data, and shifts a TDO boundary scan test signal through the boundary scan cells 131–133 via the TDI terminal of the boundary scan cell 131 of the boundary scan device 130. Afterward, the boundary scan test signals are output as latch output to the boundary scan test output terminals A1 and A2 and boundary scan test output terminals C1 and C2. The boundary scan test result signals are then read into the boundary scan test input terminals B1, B2, D1 and D2. The signals at the boundary scan test input terminals and output terminals A1, A2, B1, B2, C1, C2, D1 and D2 are then shifted through the boundary scan cells 131–133 and are input into the TDI terminal of the test signal processor 126 via the TDO terminal of the boundary scan cell 133. The series of signal flows just described is the series of signal flows that occurs when one packet, or boundary scan test pattern vector, is tested. This is the same series of signal flows as shown in FIG. 2. Thus, as shown in FIG. 2, the series of signal flows which occur when a single packet is tested on the boundary scan device includes a boundary scan test signal shift 201 followed by a boundary scan test signal latch output 202 followed by a boundary scan test result signal read-in 203 followed by a boundary scan test result signal shift 204.

At the same time that this boundary scan test is being executed, the digital I/O controller 123 operates so that digital logic signals of "1" or "0" continue to be output from the output terminal of the digital I/O controller 123 to both the output of the buffer 135 and the input terminal of the inverter 134 in the boundary scan device 130 only during the interval extending from the boundary scan test signal latch output 202 to the boundary scan test result signal read-in 203 in FIG. 2. Accordingly, in the case of output from the inverter 134 in response to these signals, signals which are input into the boundary scan test input terminal G of the boundary scan cell 133 are taken into the boundary scan test input terminal G of the boundary scan cell 133 during the boundary scan test result signal read-in 203 shown in FIG. 2, and are shifted according to the timing of the boundary scan test result signal shift 204 and input into the TDI terminal of the test signal processor 126 together with the signals at the boundary scan test input terminals and output terminals A1, A2, B1, B2, C1, C2, D1, and D2.

Using the boundary scan test result signal data shifted back to the TDI terminal of the test signal processor 126 and the expected-value data taken in by the test signal processor 126 from the analysis data generator 118, the test signal processor 126 performs a comparison in order to ascertain whether or not the boundary scan test result signal data agrees with the expected-value data. If the boundary scan device 130 is normal, the data of the boundary scan test result signals show agreement with the expected-value data. However, if there is a fault in the boundary scan device 130, the data of the boundary scan test result signals differs from the expected-value data. The agreement (OK) or nonagreement (NG) results for the boundary scan device 30 are returned to the test controller 121 from the test signal processor 126. If the results are OK, the test controller 121 sends an instruction to the result data recorder 124 indicating that the results should be recorded, and the result data recorder 124 records the OK results in the data records file 125. On the other hand, in cases where the results are NG, the test controller 121 sends an instruction to the fault analyzer 122 so that the boundary scan test result signal data which has returned to the test signal processor 126 and the expected-value data predicted from the test signals in accordance with the test execution data are taken in by the fault analyzer 122 from the test signal processor 126 via the test controller 121. Furthermore, circuit information for the tested circuit portions of the boundary scan device 130 which is necessary in order to specify the nature and location of the fault is also taken in by the fault analyzer 122, and the fault analyzer 122 thus analyzes the nature and location of the fault in the boundary scan device 130.

As an example, if a short circuit should occur between the wiring A1–B1 and A2–B2 of the boundary scan cells 131 and 132 in FIG. 6, the cause of this fault is analyzed as a short circuit occurring between the terminals A1, A2, B1 and B2 of the boundary scan cells 131 and 132 and the first and second terminals of the connector 136. In actuality, however, the first terminal and second terminal of the connector 136 are respectively connected to A1, B1 and A2, B2 of the boundary scan cells 131 and 132. As a result, a short between the first and second terminals of connector 136 cannot be analyzed, since the circuit information in the analysis data generator 118 contains only information concerning connections between the boundary scan cells 131–133. Accordingly, the system is arranged so that the operator of the boundary scan testing device 100 also infers shorting between the first and second terminals of the connector 136 as the cause of a fault from the expression of shorting among A1, A2, B1, and B2 of the boundary scan cells 131, 132.

Results thus obtained by analysis are returned to the test controller 121 by the fault analyzer 122. The test controller 121 sends an instruction to the result data recorder 124 indicating that these results including the nature and location of faults should be recorded, and the result data recorder 124 records the results in the data records file 125.

Thus, in the preferred embodiment of FIG. 6, a boundary scan testing device 100 which has an external boundary scan test vector generator 112 for producing boundary scan test vectors corresponding to the device under test 130 is used to execute tests by preparing actual test execution data using a test vector file 108 produced by the external boundary scan test vector generator 112. Furthermore, the boundary scan testing device 100 has an analysis data generator 118 which produces expected-value data and circuit information for the circuit portions to be tested within the device under test 130 from a comment portion in the test vector file 108 expressing the aforementioned boundary scan test vectors. The expected-value data and circuit information produced by the analysis data generator 118 includes data necessary for the analysis of test results which has conventionally been obtained from the boundary scan test vector generator 112 since such data cannot be expressed as meaningful data in the aforementioned VCL descriptive format.

In accordance with the present invention shown in the embodiment of FIG. 6, a boundary scan testing device can be build inexpensively without suffering from increased expense as a result of the provision of a boundary scan test vector generator as is necessary in conventional boundary scan testing devices.

It will also be appreciated by one skilled in the art that the preferred embodiment shown in FIG. 6 may operate such that digital logic signals of "1" or "0" continue to be output from the output terminal of the digital I/O controller 123 to both the output of buffer 135 and input terminal of the inverter 134 only during the interval extending from the boundary scan test signal latch output 202 to the boundary scan test result signal read-in 203 in FIG. 2. However, this system may also be constructed such that the digital I/O controller 123 outputs signals of "1" or "0" to both the output of the buffer 135 and input terminal of the inverter 134 before the boundary scan test signal shift 201 shown in FIG. 2 is performed. Then, after the boundary scan test signal shift 201, boundary scan test signal latch output 202, boundary scan test result signal read-in 203 and boundary scan test result signal 204, which comprise the series of signal flows occurring when one packet is tested as shown in FIG. 2, have been executed, the output terminal of the digital I/O controller 123 is again set if necessary. Accordingly, if the system is designed so that the signals input into the boundary scan test input terminal G of the boundary scan cell 133 in the case of output from the inverter 134 in response to signals from the output terminal of the digital I/O controller 123 are taken into the boundary scan test input terminal G of the boundary scan cell 133 during the boundary scan test result signal read-in 203 shown in FIG. 2, and are shifted according to the timing of the boundary scan test result signal shift 204 and input into the TDI terminal of the test signal processor 126 together with the signals at the boundary scan test input and output terminals A1, A2, B1, B2, C1, C2, D1 and D2, the test controller 121 which controls the output timing of the digital I/O controller 123 can be simplified so that an even less expensive boundary scan testing device can be constructed.

Figure 9:
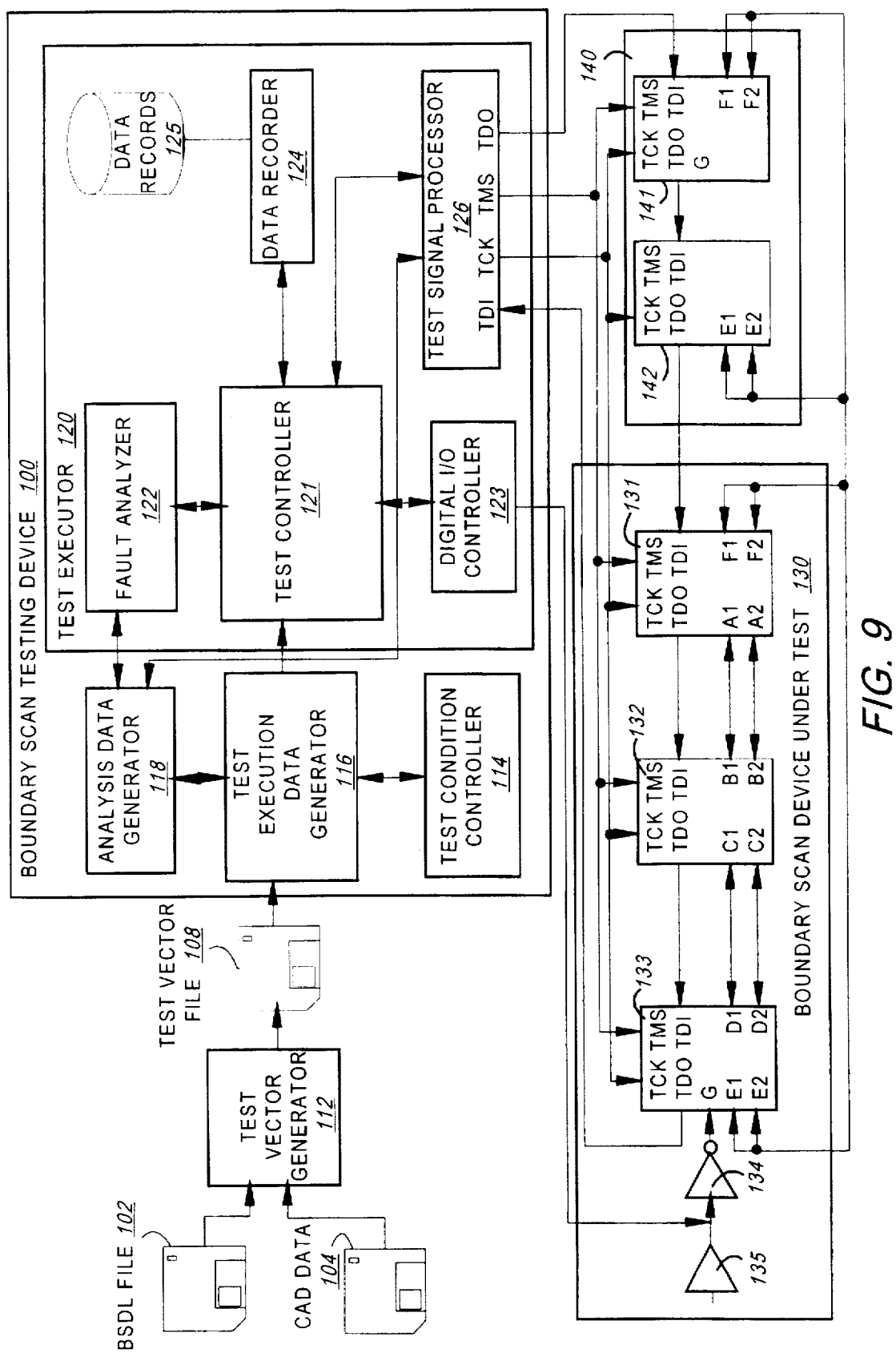
FIG. 9 shows the testing configuration.

FIG. 9 is a block diagram of a second preferred embodiment of a boundary scan testing device 100 of the present invention. As shown in FIG. 9, a boundary scan test vector generator 112, residing separately from the boundary scan testing device 100, receives a description of the boundary scan cell structure of a device under test 130 and boundary scan mode shifting commands from a boundary scan description language (BSDL) file 102 and computer-aided design (CAD) data 104 including circuit diagram information for the device under test 130, and produces boundary scan test vectors for use in testing the device under test 130. The boundary scan test vectors produced by the boundary scan test vector generator 112 are recorded in a test vector file 108.

The boundary scan testing device 100 includes a test execution data generator 116 which produces test execution data from the test vector file 108 and data from a test condition controller 114 which sets the testing conditions. The boundary scan testing device 100 also includes an analysis data generator 118. The analysis data generator 118 receives the contents of the test vector file 108 input into the test execution data generator 116 and produces analysis data from the comment portions of the test vector file 108. Analysis data is necessary in order to specify the nature and location of faults that occur when a boundary scan test is executed.

The boundary scan testing device 100 also includes a test executor 120. The test executor 120 includes a test controller 121 which controls the overall execution of the boundary scan test based on test execution data received from the test execution data generator 116. The test executor 120 also includes a fault analyzer 122 which analyzes the causes of faults and locations of faults occurring when the boundary scan test is executed. A test signal processor 126 is also included in the test executor 120. The test signal processor 126 performs the I/O of boundary scan test signals under the control of the test controller 121, and includes boundary scan test signal terminals TDI, TDO, TCK, and TMS for boundary scan test signals including test data in (TDI), test data out (TDO), test clock (TCK) and test mode signal (TMS). The test executor 120 also includes a result data recorder 124 which controls result data from the boundary scan test and records it in a data records file 125.

The testing configuration of FIG. 9 includes an interface box 140 which has a boundary scan circuit for use by the boundary scan testing device 100. The interface box 140 includes boundary scan cells 141, 142. The testing configuration of FIG. 9 further includes a device under test 130 including boundary scan cells 131–133 which may be tested by the boundary scan testing device 100. As known by those skilled in the art, the device under test 130 may include any number of boundary scan cells. Each of the boundary scan cells 141–142 of the interface box 140 and boundary scan cells 131–133 of the device under test 130 include boundary scan test signal terminals TDI, TDO, TCK, and TMS for boundary scan test signals including test data in (TDI), test data out (TDO), test clock (TCK) and test mode signal (TMS). As shown in FIG. 9, each of the TCK and TMS terminals of the test signal processor 126, the boundary scan cells 141–142, and the boundary scan cells 131–133 are tied together such that each of the boundary scan cells 141–142 and 131–133 receive the same test clock and test mode select signals at the same time. As also shown in the embodiment of FIG. 9, the TDO terminal of the test signal processor 126 is electrically connected to the TDI terminal of the boundary scan cell 141 of the interface box 140, the TDO terminal of the boundary scan cell 141 is electrically connected to the TDI of the boundary scan cell 142, the TDO terminal of the boundary scan cell 142 is electrically connected to the TDI of the boundary scan cell 131 of the device under test 130, the TDO terminal of the boundary scan cell 131 is electrically connected to the TDI of the boundary scan cell 132, the TDO terminal of the boundary scan cell 132 is electrically connected to the TDI of the boundary scan cell 133, and the TDO terminal of the boundary scan cell 133 is electrically connected to the TDI terminal of the test signal processor 126. In addition, the signal terminals F1 and F2 of the boundary scan cell 141 of the interface box 140 are respectively electrically connected to the signal terminals F1 and F2 of the boundary scan cell 131 of the device under test 130. Moreover, the signal terminals E1 and E2 of the boundary scan cell 142 of the interface box 140 are respectively electrically connected to the signal terminals E1 and E2 of the boundary scan cell 133 of the device under test 130. Furthermore, the boundary scan test output terminals A1 and A2 of the boundary scan cell 131 are electrically connected to the boundary scan test input terminals B1 and B2 of the boundary scan cell 132. The terminal A1 of the boundary scan cell 31 and the terminal B1 of the boundary scan cell 132 are also electrically connected to a first terminal of a connector 136, and the terminal A2 of the boundary scan cell 131 and the terminal B2 of the boundary scan cell 132 are connected to a second terminal of the connector 136. Additionally, the boundary scan test output terminals C1 and C2 of the boundary scan cell 132 are electrically connected to the boundary scan test input terminals D1 and D2 of the boundary scan cell 133.

The digital input-output (I/O) part 123 of the test executor 120 of the boundary scan testing device 100 inputs and outputs digital signals, other than the boundary scan test signals TDI, TDO, TCK and TMS, used for the testing of the boundary scan device 130. The boundary scan device 130 shown in FIG. 9 also includes an inverter 134 and a buffer 135. The output of the buffer 135 is electrically connected to the input of the inverter 134. The output of the inverter 134 is electrically connected to the boundary scan test input terminal G of the boundary scan cell 133. Both the output of the buffer 135 and the input of the inverter 134 are connected to the output terminal of the digital I/O controller 123.

The boundary scan testing device 10 operates as follows. First, the BSDL file 102, which contains BSDL files for the boundary scan cells 141–142 inside the interface box 140 and BSDL files for the boundary scan cells 131–133 of the boundary scan device 130, and the CAD data 104, which includes circuit diagram information for the connected state of the boundary scan cells 141–142 of the interface box 140 and the boundary scan cells 131–133 of the boundary scan device 130 are supplied to the boundary scan test vector generator 112, which is located separately from the boundary scan testing device 100. Accordingly, the boundary scan test vector generator 112 extracts the circuit that is to be subjected to boundary scan testing from the CAD data 104, and produces boundary scan test vectors corresponding to the boundary scan device 130 in the vector control language (VCL) format while referring to the BSDL file 102, in which the boundary scan cell structures of the boundary scan cells 141–142 and 131–133 and commands for shifting to various boundary scan modes are described. This boundary scan test vector data is output to the test vector file 108.

The test vector file 108 may be supplied to the test execution data generator 116 of a boundary scan testing device 100 at a later time. The boundary scan testing device 100 may reside at a different location than the boundary scan test vector generator 112, possibly at a diagnostics site or another manufacturing site. When a device under test 130 is to be tested, the test vector file 108 is supplied to the test execution data generator 116 of the boundary scan testing device 100. An operator may input power supply timing information and set circuit conditions for the boundary scan device 130 into the test condition controller 114. The set circuit conditions are then transferred to the test execution data generator 116 from the test condition controller 114. The test execution data generator 116 then corrects the boundary scan test vectors of the boundary scan device 130 in accordance with these test conditions, and produces test execution data.

In the meantime, the analysis data generator 118 receives the contents of the test vector file 108 from the test execution data generator 116. In this case, the circuit information, including expected-value data and device boundary scan cell numbers, connecting pin numbers and connecting pin signal names, are not handled as comments which are expressed for convenience in a comment portion located at the end of the test vector file 108, which is expressed in the aforementioned VCL descriptive format as shown in FIG. 3. Instead, such information is arranged as shown in the example in FIG. 7 so that it can be used as data for specifying the nature and location of faults that occur when a boundary scan test is performed.

Furthermore, the expected-value data expressed in the comment portion of the test vector file 108 is rearranged by the analysis data generator 118 as shown in the example of FIG. 8.

Thus, using circuit information of the interface box 140 and device under test 130, including device boundary scan cell numbers, connecting pin numbers and connecting pin signal names, as well as expected-value data, which cannot be expressed as meaningful data within the boundary scan test vector data (which is expressed in the aforementioned VCL descriptive format), but which is instead expressed for convenience in a comment portion located at the end of the boundary scan test vector data within the test vector file 108 as a reference which can be used when a person examines the boundary scan test vectors, the analysis data generator 118 regenerates circuit information and expected-value data as meaningful data which can be utilized for the judgement of results and analysis of faults in boundary scan testing.

Accordingly, boundary scan testing is executed by the test executor 120 based on test execution data produced by the test execution data generator 116 of the boundary scan testing device 100.

The test executor 120 includes a test controller 121 which controls the overall execution of the boundary scan test on the basis of the test execution data. The test controller 121 sends a command to the test signal processor 126 indicating that boundary scan test signals are to be sent out in accordance with the test execution data. The test signal processor 126, acting in accordance with the aforementioned command, outputs TCK and TMS boundary scan test signals to all of the boundary scan cells 131–133 of the boundary scan device 130 and boundary scan cells 141–142 of the interface box 140 on the basis of the test execution data, and shifts a TDO boundary scan test signal through the boundary scan cells 141–142 and 131–133 via the TDI terminal of the boundary scan cell 141 of the interface box 140. Afterward, the boundary scan test signals are output as latch output to the boundary scan test output terminals A1 and A2 and boundary scan test output terminals C1 and C2. Then, the boundary scan test result signals are read into the boundary scan test input terminals B1, B2, D1 and D2, after which the signals at the boundary scan test input terminals and output terminals A1, A2, B1, B2, C1, C2, D1 and D2 are shifted through the boundary scan cells 131–133 and are input into the TDI terminal of the test signal processor 126 via the TDO terminal of the boundary scan cell 133. This series of signal flows is the same series of signal flows that occurs when one packet is tested, as shown in FIG. 2.

At the same time that this boundary scan test is being executed, the digital I/O controller 123 operates so that signals of "1" or "0" continue to be output from the output terminal of the digital I/O controller 123 to both the output of the buffer 135 and the input terminal of the inverter 134 in the boundary scan device 130 only during the interval extending from the boundary scan test signal latch output 202 to the boundary scan test result signal read-in 203 in FIG. 2. Accordingly, in the case of output from the inverter 134 in response to these signals, signals which are input into the boundary scan test input terminal G of the boundary scan cell 133 are taken into the boundary scan test input terminal G of the boundary scan cell 133 during the boundary scan test result signal read-in 203 shown in FIG. 2, and are shifted according to the timing of the boundary scan test result signal shift 204 and input into the TDI terminal of the test signal processor 126 together with the signals at the boundary scan test input terminals and output terminals A1, A2, B1, B2, C1, C2, D1, and D2, and the signals at the signal terminals E1, E2, F1 and F2 of the boundary scan cells 131–133 and 141–142.

Using the boundary scan test result signal data shifted back to the TDI terminal of the test signal processor 126 and the expected-value data taken in by the test signal processor 126 from the analysis data generator 118, the test signal processor 126 performs a comparison in order to ascertain whether or not the boundary scan test result signal data agrees with the expected-value data. If the boundary scan device 130 is normal, the data of the boundary scan test result signals show agreement with the expected-value data. However, if there is a fault in the boundary scan device 130, the data of the boundary scan test result signals differs from the expected-value data. The OK/NG results for the boundary scan device 30 are returned to the test controller 121 from the test signal processor 126. If the results are OK, the test controller 121 sends an instruction to the result data recorder 124 indicating that the results should be recorded, and the result data recorder 124 records the OK results in the data records file 125. On the other hand, in cases where the results are NG, the test controller 121 sends an instruction to the fault analyzer 122 so that the boundary scan test result signal data which has returned to the test signal processor 126 and the expected-value data predicted from the test signals in accordance with the test execution data are taken in by the fault analyzer 122 from the test signal processor 126 via the test controller 121. Furthermore, circuit information for the boundary scan cells 141–42 inside the interface box 140 and the tested circuit portions of the boundary scan device 130 which is necessary in order to specify the nature and location of the fault is also taken in by the fault analyzer 122, and the fault analyzer 122 thus analyzes the nature and location of the fault in the boundary scan device 130.

Results thus obtained by analysis are returned to the test controller 121 by the fault analyzer 122. The test controller 121 sends an instruction to the result data recorder 124 indicating that these results concerning the nature and location of faults should be recorded, and the result data recorder 124 records the results concerning the nature and location of faults in the data records file 125.

Since the aforementioned interface box 140 is installed in the testing configuration of FIG. 9, the range of boundary scan testing is increased. If this interface box 140 were not installed, the abovementioned range would include only the areas surrounded by the wiring running to the respective TDI, TDO, TCK and TMS terminals of the boundary scan cells 131–133 of the device under test 130, the wiring running between the boundary scan test output terminals A1 and A2 of the boundary scan cell 131 and the boundary scan test input terminals B1 and B2 of the boundary scan cell 132, the wiring running between the boundary scan test output terminals C1 and C2 of the boundary scan cell 132 and the boundary scan test input terminals D1 and D2 of the boundary scan cell 133, the wiring between the output terminal of the digital I/O controller 123 and the output terminal of the buffer 135 and input terminal of the inverter 134, and the wiring between the output terminal of the inverter 134 and the boundary scan test input terminal G of the boundary scan cell 133. However, since the abovementioned interface box 140 is installed, and since the signal terminal F1 and F2 of the boundary scan cell 131 of the device under test 130 and the signal terminals E1 and E2 of the boundary scan cell 133 of the device under test 130 are also respectively connected to the signal terminals F1 and F2 of the boundary scan cell 141 and the signal terminals E1 and E2 of the boundary scan cell 142 in the interface box 140, the signal terminals F1, F2, E1, and E2 of the boundary scan cells 131 and 133 are also included in the range of boundary scan testing.

As a result, the range of the device under test 130 that can be subjected to boundary scan testing includes not only the areas surrounded by the wiring running to the respective TDI, TDO TCK and TMS terminals of the boundary scan cells 131–133 of the device under test 130, the wiring running between the boundary scan test output terminals A1 and A2 of the boundary scan cell 131 and the boundary scan test input terminals B1 and B2 of the boundary scan cell 132, the wiring running between the boundary scan test output terminals C1 and C2 of the boundary scan cell 132 and the boundary scan test input terminals D1 and D2 of the boundary scan cell 133. The wiring between the output terminal of the digital I/O controller 123 and the input terminal of the buffer 135 and input terminal of the inverter 134, and the wiring between the output terminal of the inverter 134 and the boundary scan test input terminal G of the boundary scan cell 133, but also the signal terminals F1, F2, E1, E2 of the boundary scan cells 141–142.

Thus, by installing an interface box 140 with boundary scan cell between the boundary scan testing device 100 and the device under test 130, and connecting this interface box 140 to the boundary scan circuit portions located in the device under test 130, the present invention increases the range of boundary scan testing so that the efficiency of boundary scan testing of the device under test 130 can be improved.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A boundary scan testing device comprising:

a test execution data generator which uses boundary scan vectors, which correspond to a boundary scan device under test and which are produced by a boundary scan test vector generator separate from said boundary scan testing device, to produce execution data based on said boundary scan test vectors and on test conditions;

a test condition controller which sets said test conditions;

a test executor which executes a boundary scan test based on said execution data; and an analysis data generator which produces analysis data comprising circuit information for said boundary scan device under test and expected value data from comment portions of said boundary scan vectors which, while being added to said boundary scan vectors, are not used in the production of said execution data, wherein said analysis data allows said boundary scan testing device to analyze test results of said boundary scan test.

2. The boundary scan testing device of claim 1, wherein said test executor controls boundary scan test signals comprising a test data input signal (TDI), a test data output signal (TDO), a test clock signal (TCK) and a test mode select signal (TMS), which are input and output to boundary scan test signal connectors of said boundary scan device under test only during a series of signal flows comprising a boundary scan test signal shift, a boundary scan test signal latch output, a boundary scan test signal read-in, and a boundary scan test result signal shift, and wherein said test executor controls digital input/output signals other than said boundary scan test signals only before said series of signal flows.

3. A boundary scan testing device comprising:

a test execution data generator which uses boundary scan vectors, which correspond to a boundary scan device under test having boundary scan test signal connectors for inputting and outputting boundary scan test signals and which are produced by a boundary scan test vector generator separate from said boundary scan testing device, said test execution data generator controlling boundary scan test signals comprising a test data input signal (TDI), a test data output signal (TDO), a test clock signal (TCK) and a test mode select signal (TMS) which are input and output to said boundary scan device under test, and said test execution data generator producing execution data based on said boundary scan test vectors and on test conditions;

a test condition controller which sets said test conditions;

a test executor which executes a boundary scan test based on said execution data;

an analysis data generator which produces analysis data comprising circuit information for said boundary scan device under test and expected value data from comment portions of said boundary scan vectors which, while being added to said boundary scan vectors, are not used in the production of said execution data, wherein said analysis data allows said boundary scan testing device to analyze test results of said boundary scan test; and an interface box comprising a boundary scan interface circuit having boundary scan test signal connections for inputting and outputting said boundary scan test signals, wherein said boundary scan device under test and said boundary scan interface circuit form a single boundary scan circuit when said boundary scan test signal connectors of said boundary scan interface circuit are connected to said boundary scan test signal connectors of said boundary scan device under test.

* * * * *